United States Patent
Chang et al.

(10) Patent No.: US 11,545,447 B2
(45) Date of Patent: Jan. 3, 2023

(54) METHOD OF FORMING SEMICONDUCTOR DEVICE

(71) Applicant: UNITED MICROELECTRONICS CORP., Hsin-Chu (TW)

(72) Inventors: Wei-Hsuan Chang, Tainan (TW); Ming-Hua Tsai, Tainan (TW); Chin-Chia Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/394,394

(22) Filed: Aug. 4, 2021

(65) Prior Publication Data

US 2021/0366843 A1   Nov. 25, 2021

Related U.S. Application Data

(62) Division of application No. 16/737,928, filed on Jan. 9, 2020, now Pat. No. 11,114,390.

(51) Int. Cl.
| | |
|---|---|
| *H01L 23/00* | (2006.01) |
| *H01L 21/762* | (2006.01) |
| *H01L 27/06* | (2006.01) |
| *H01L 49/02* | (2006.01) |
| *H01L 23/522* | (2006.01) |
| *H01L 27/08* | (2006.01) |
| *H01L 21/3105* | (2006.01) |

(52) U.S. Cl.
CPC ...... *H01L 23/562* (2013.01); *H01L 21/76224* (2013.01); *H01L 23/5226* (2013.01); *H01L 23/5228* (2013.01); *H01L 27/0688* (2013.01); *H01L 27/0814* (2013.01); *H01L 28/20* (2013.01); *H01L 21/31053* (2013.01)

(58) Field of Classification Search
CPC ............. H01L 23/562; H01L 21/76224; H01L 23/5226; H01L 27/0688; H01L 23/5228; H01L 27/0814; H01L 28/20
USPC .......... 438/207, 218, 210, 294.427; 257/505, 257/506
See application file for complete search history.

(56) References Cited

U.S. PATENT DOCUMENTS

| | | |
|---|---|---|
| 8,901,673 B2 | 12/2014 | Onda |
| 2010/0052060 A1 | 3/2010 | Lai |
| 2019/0027603 A1* | 1/2019 | Cheng et al. ....... H01L 29/0653 |
| 2019/0057962 A1 | 2/2019 | Lu |

* cited by examiner

*Primary Examiner* — Thinh T Nguyen
(74) *Attorney, Agent, or Firm* — Winston Hsu

(57) ABSTRACT

A semiconductor device includes a substrate, a first isolation structure, a second isolation structure and a dummy pattern. The substrate includes a first part surrounding a second part at a top view. The first isolation structure is disposed between the first part and the second part, to isolate the first part from the second part. The second isolation structure is disposed at at least one corner of the first part. The dummy pattern is disposed on the second isolation structure. The present invention also provides a method of forming said semiconductor device.

7 Claims, 8 Drawing Sheets

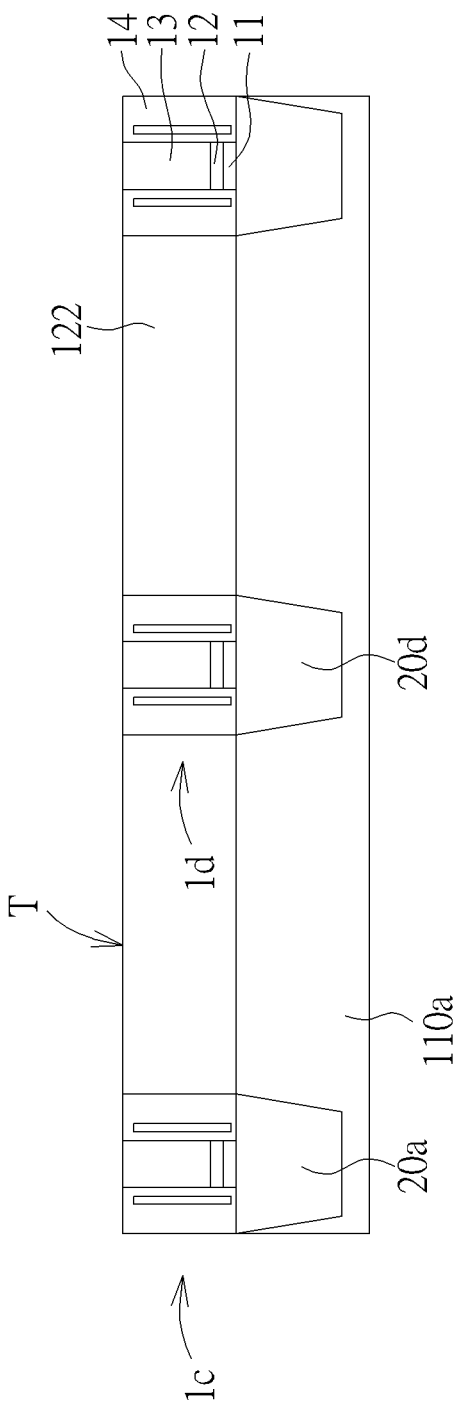
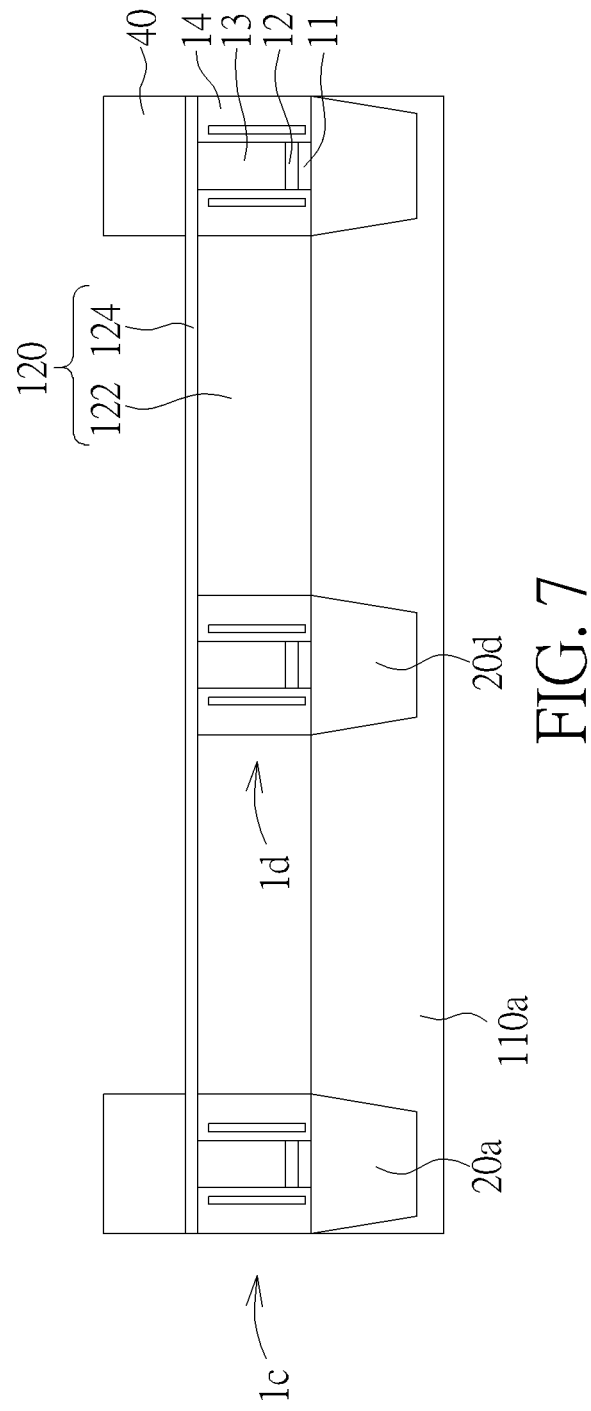

METHOD OF FORMING SEMICONDUCTOR DEVICE

CROSS REFERENCE TO RELATED APPLICATIONS

This application is a divisional application of and claims the benefit of U.S. patent application Ser. No. 16/737,928, filed Jan. 9, 2020.

BACKGROUND OF THE INVENTION

1. Field of the Invention

The present invention relates generally to a semiconductor device and forming method thereof, and more specifically to a semiconductor device applying dummy patterns and forming method thereof.

2. Description of the Prior Art

In the semiconductor industry, chemical mechanical polishing (CMP) is the most common and important planarization tool applied. For example, the CMP process can be used to remove a topographical target of a thin film layer on a semiconductor wafer. The CMP process produces a wafer with both a regular and planar surface, to ensure a depth of focus (DOF) in the following photo process. Certain complications are involved in the CMP process, including the property of the target thin film layer, uniformity of the target thin film surface, composition and pH value of the slurry, composition of the polishing pad, platen rotational speed, head down force, etc. For example, as an area such as a diode area of the target thin film has a wide or isolated part, loading effect would occur and lead to divots at the target thin film surface after CMP process. As a result, this rough target thin film surface would degrade the performance and the reliability of devices.

SUMMARY OF THE INVENTION

The present invention provides a semiconductor device and forming method thereof, which forms dummy patterns at corners of diodes, so that the pattern density of this diode area can be increased to enhance performance by preventing divots, structural cracking, and metal residues from occurring, and the structural uniformity of this area can be improved as well.

The present invention provides a semiconductor device including a substrate, a first isolation structure, a second isolation structure and a dummy pattern. The substrate includes a first part surrounding a second part at a top view. The first isolation structure is disposed between the first part and the second part, to isolate the first part from the second part. The second isolation structure is disposed at at least one corner of the first part. The dummy pattern is disposed on the second isolation structure.

The present invention provides a method of forming a semiconductor device including the following steps. A first isolation structure and a second isolation structure are formed in a substrate, wherein the substrate is divided into a first part and a second part by the first isolation structure, the first part surrounds the second part at a top view, and the second isolation structure is at at least one corner of the first part. A dummy pattern is formed and is directly on the second isolation structure.

According to the above, the present invention provides a semiconductor device and forming method thereof, which forms a first isolation structure and a second isolation structure in a substrate, wherein the substrate is divided into a first part and a second part by the first isolation structure, the first part surrounds the second part at a top view, and the second isolation structure is at at least one corner of the first part; and forms a dummy pattern directly on the second isolation structure. Therefore, the pattern density of a diode area can be increased to prevent divots of dielectric layers, structural cracking above the dielectric layers, and metal residues after planarizing from occurring, and the structural uniformity of this area can be improved as well.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 schematically depicts a cross-sectional view of a semiconductor process according to an embodiment of the present invention.

FIG. 7 schematically depicts a cross-sectional view of a semiconductor process according to an embodiment of the present invention.

DETAILED DESCRIPTION

Figure 1:
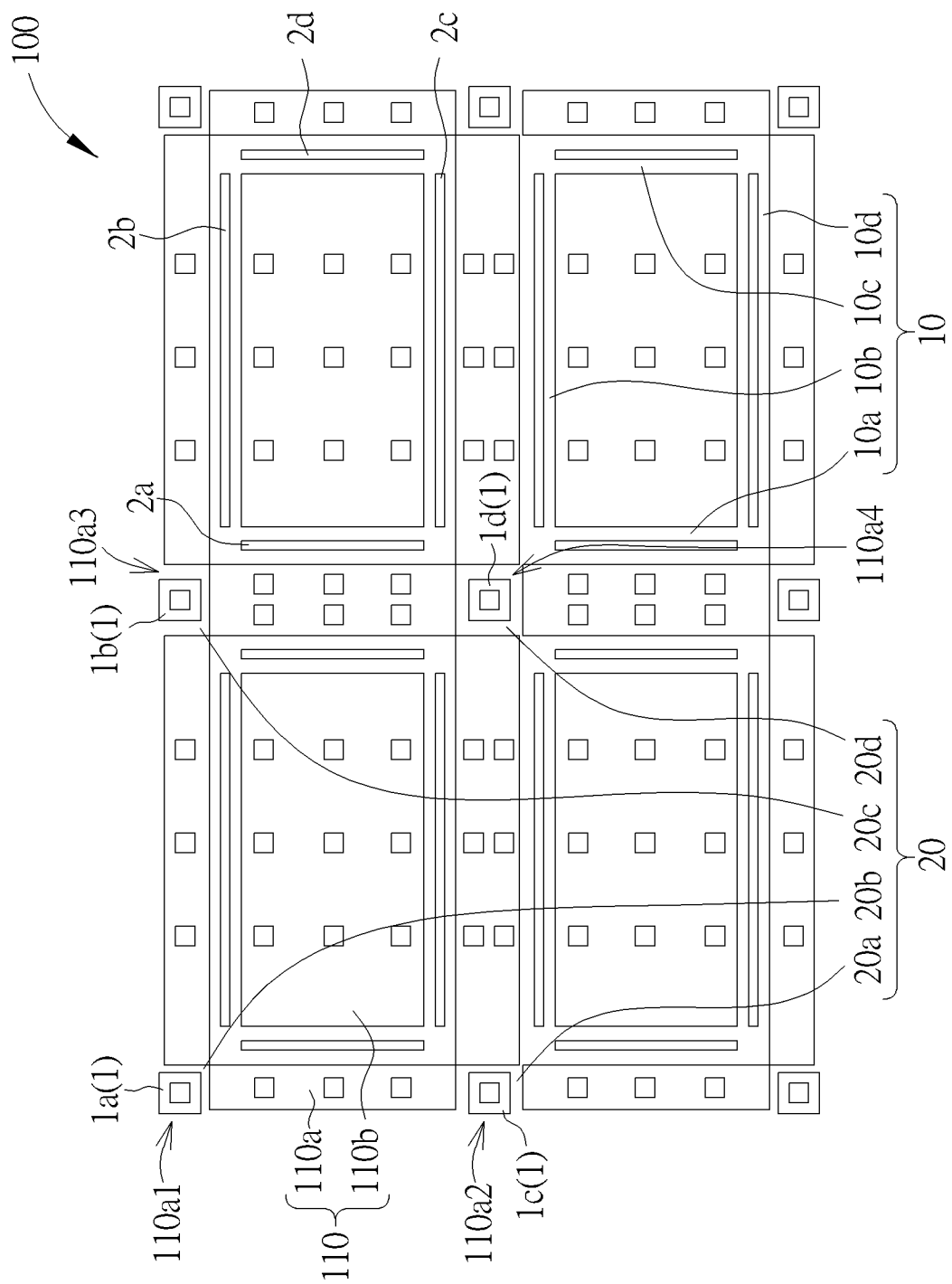
FIG. 1 schematically depicts a top view of a semiconductor device according to an embodiment of the present invention.
Figure 9:
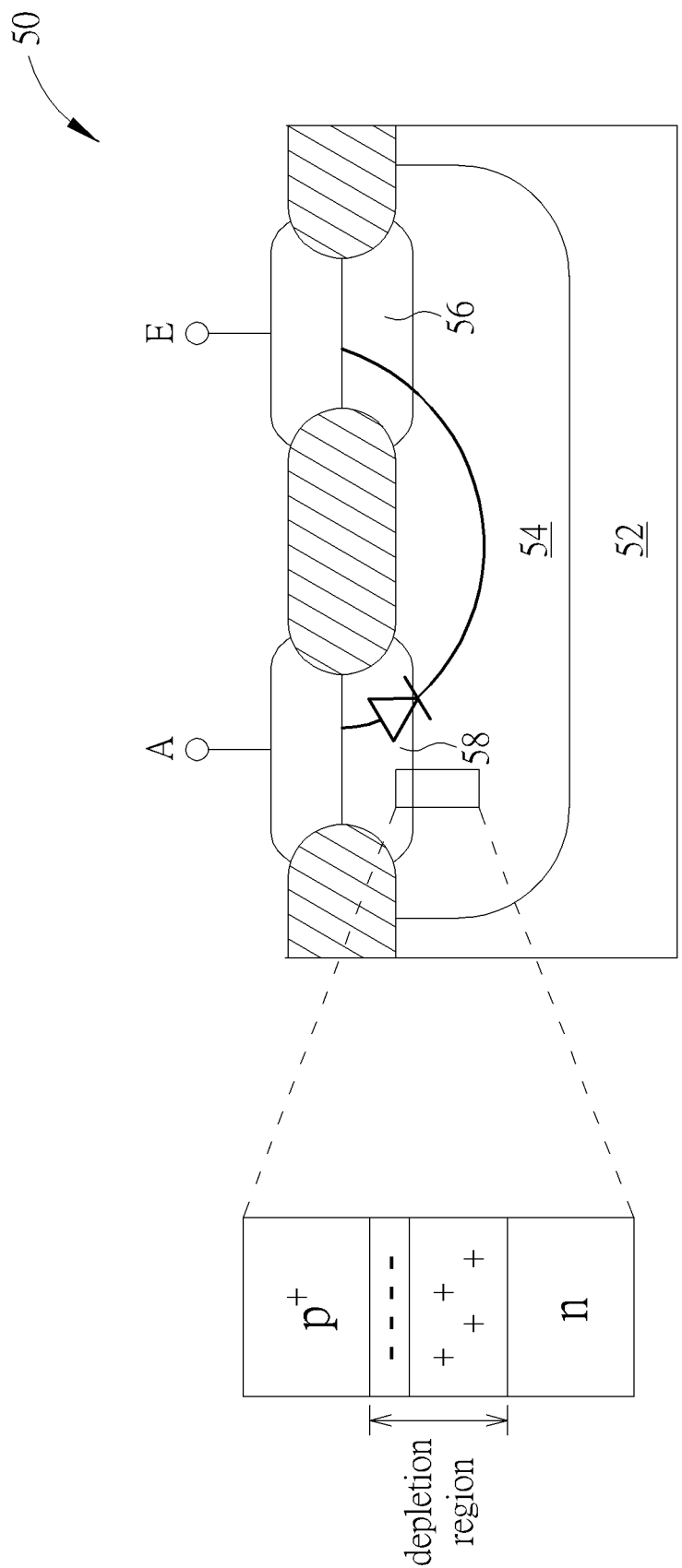
FIG. 9 schematically depicts a cross-sectional view of a diode according to an embodiment of the present invention.

FIG. 1 schematically depicts a top view of a semiconductor device according to an embodiment of the present invention. As shown in FIG. 1, a diode layout 100 including a dummy pattern 1 is provided. In this embodiment, a substrate 110 may include a plurality of first parts 110a and a plurality of second parts 110b. A first isolation structure 10 is disposed between the first parts 110a and the second parts 110b, to isolate the first parts 110a from the second parts 110b. In this case, the second parts 110b are arranged regularly, and each of the second parts 110b is surrounded by one corresponding first part 110a, to constitute a diode array, but it is not limited thereto. The substrate 110 may be a semiconductor substrate such as a silicon substrate, a silicon containing substrate, a III-V group-on-silicon (such as GaNon-silicon) substrate, a graphene-on-silicon substrate, a silicon-on-insulator (SOI) substrate or a substrate containing epitaxial layers etc. The first isolation structure 10 may be a shallow trench isolation (STI) structure, which may be formed by a shallow trench isolation process, and the forming method is known in the art, and will not be described herein, but it is not limited thereto. Each of the first parts 110*a* surrounds the corresponding second part 110*b* at a top view, and the first parts 110*a* and the second part 110*b* are diffusion regions having different conductive type, thereby each of first parts 110*a* and the corresponding second part 110*b* constitute a diode. FIG. 9 schematically depicts a cross-sectional view of a diode according to an embodiment of the present invention. As shown in FIG. 9, a diode 50 may include a p-type substrate 52, and an n-doped well 54, an n+ diffusion region 56 and a p+ diffusion region 58 in the p-type substrate 52, but it is not limited thereto, wherein the n-doped well 54 is between the n+ diffusion region 56 and the p+ diffusion region 58. Thus, a PN junction between the n-doped well 54 and the p+ diffusion region 58 formed a depletion region. While a positive voltage is applied, a current flows from an anode A to a cathode E passing through the p+ diffusion region 58, the n-doped well 54, and the n+ diffusion region 56. While a negative voltage is applied, the diode 50 turns off.

In one embodiment, each of the first parts 110*a* has a rectangular frame shape at the top view, and thus each of the first parts 110*a* has four corners 110*a*1/110*a*2/110*a*3/110*a*4, but it is not limited thereto. A second isolation structure 20 is disposed at at least one corner 110*a*1/110*a*2/110*a*3/110*a*4 of each of the first parts 110*a*. Preferably, the second isolation structure 20 includes four isolation parts 20*a*/20*b*/20*c*/20*d* disposed at the four corners 110*a*1/110*a*2/110*a*3/110*a*4 of each of the first parts 110*a* respectively.

The dummy pattern 1 is disposed on the second isolation structure 20. Preferably, the dummy pattern 1 includes four dummy parts 1*a*/1*b*/1*c*/1*d*, and the four dummy parts 1*a*/1*b*/1*c*/1*d* are disposed on the four isolation parts 20*a*/20*b*/20*c*/20*d* respectively. The dummy parts 1*a*/1*b*/1*c*/1*d* may be polysilicon dummy parts, which may be optionally replaced by metals in a replacement metal gate process. The dummy parts 1*a*/1*b*/1*c*/1*d* may be formed while gates in other areas are formed. Each of the dummy parts 1*a*/1*b*/1*c*/1*d* is enclosed by the corresponding isolation part 20*a*/20*b*/20*c*/20*d* at the top view. Thereby, the dummy parts 1*a*/1*b*/1*c*/1*d* can be utilized to increase the pattern density in the diode layout 100, and avoid divots of layers covering the dummy parts 1*a*/1*b*/1*c*/1*d*, which may lead to cracking of above structures and metal residue after planarizing, without short circuits occurring caused by the dummy parts 1*a*/1*b*/1*c*/1*d* connected to the first parts 110*a*.

Moreover, line dummy bars 2*a*/2*b*/2*c*/2*d* may be disposed on the first isolation structure 10 to further increase the pattern density. In this embodiment, the first isolation structure 10 has a rectangular frame shape at the top view, wherein the first isolation structure 10 is constituted by four side parts 10*a*/10*b*/10*c*/10*d*. Each of the line dummy bars 2*a*/2*b*/2*c*/2*d* is disposed on the corresponding side part 10*a*/10*b*/10*c*/10*d*, to have uniform layouts and enough space to put the line dummy bars 2*a*/2*b*/2*c*/2*d* between the first parts 110*a* and the second parts 110*b*.

Figure 2:
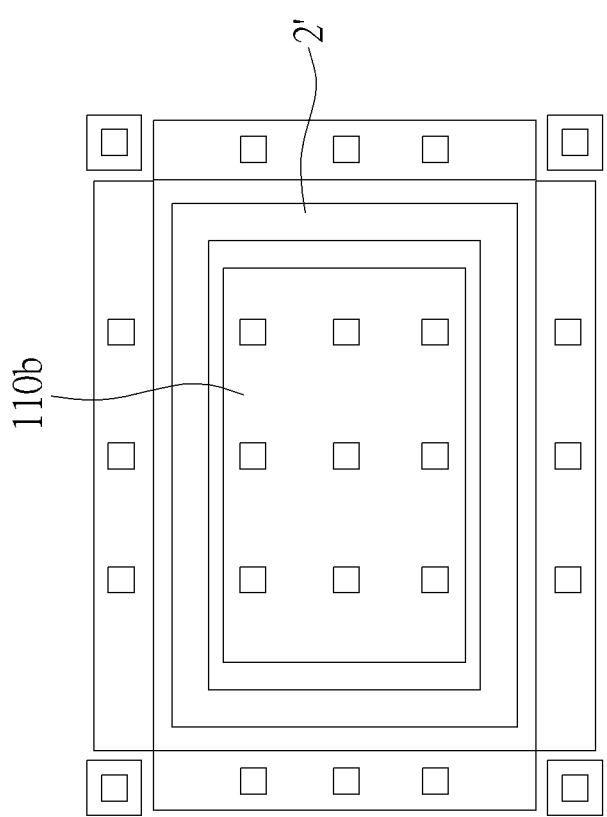
FIG. 2 schematically depicts a top view of a semiconductor device according to an embodiment of the present invention.

In another embodiment, the line dummy bar 2*a*/2*b*/2*c*/2*d* can be replaced by a line dummy frame 2', as shown in FIG. 2, which only depicts one diode for simplifying. The line dummy frame 2' may have a rectangular frame shape at a top view and surrounds the second part 110*b* to increase the pattern density.

Figure 3:
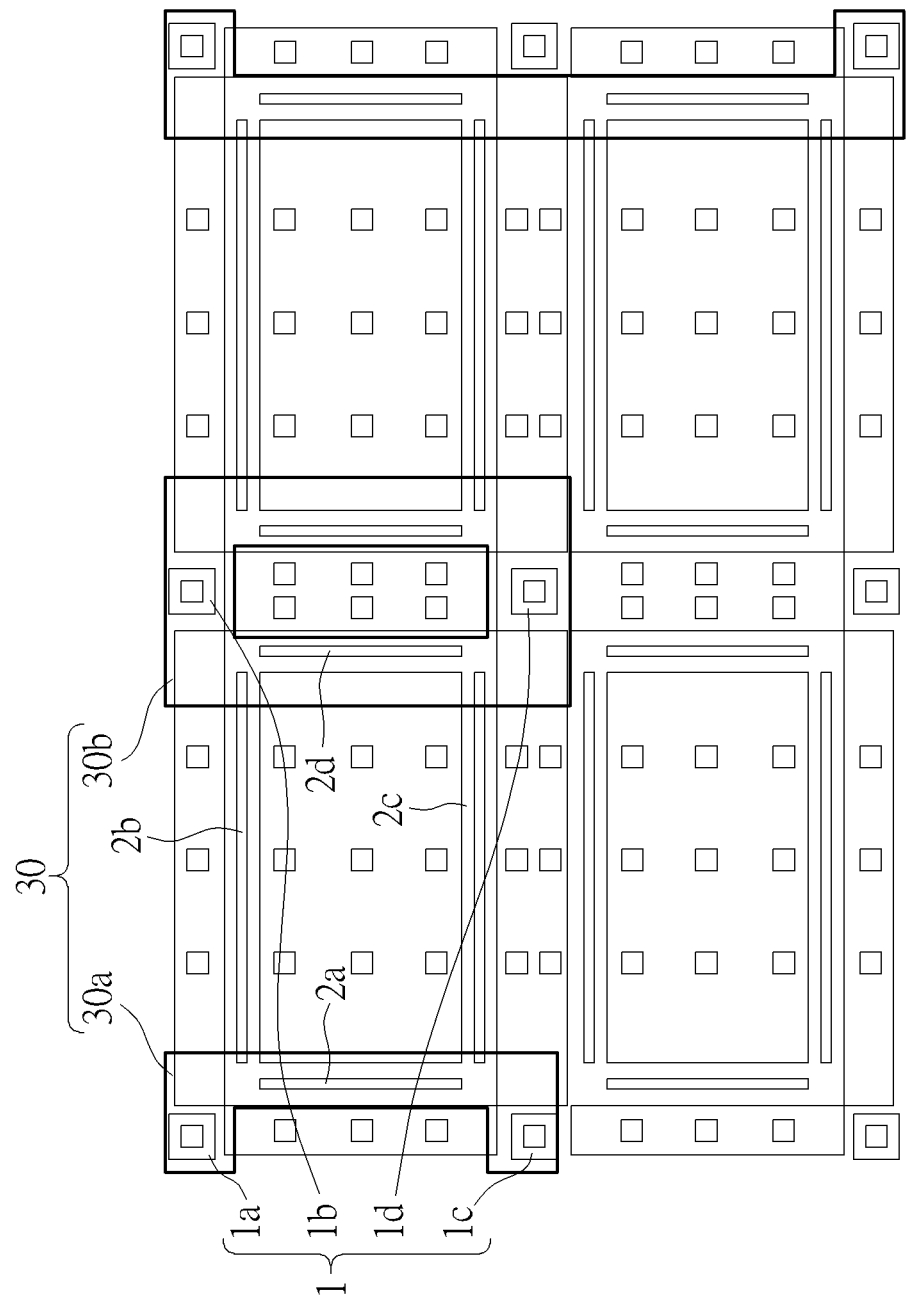
FIG. 3 schematically depicts a top view of a semiconductor device according to an embodiment of the present invention.

Furthermore, as shown in FIG. 3, a resistive layer 30 may be disposed right above the dummy pattern 1 to save space and improve the stability of the structure of the resistive layer 30. Besides, the resistive layer 30 disposed right above the dummy pattern 1 can have various lengths, depending upon practical requirements. In a preferred embodiment, the resistive layer 30 has U-shapes 30*a*/30*b* at the top view. The U-shape 30*a* vertically overlaps the dummy parts 1*a*/1*c* and the line dummy bar 2*a*, and the U-shape 30*b* vertically overlaps the dummy parts 1*b*/1*d* and the line dummy bar 2*d*, to save space and improve the stability of the structure of the resistive layer 30, but it is not restricted thereto.

Figure 8:
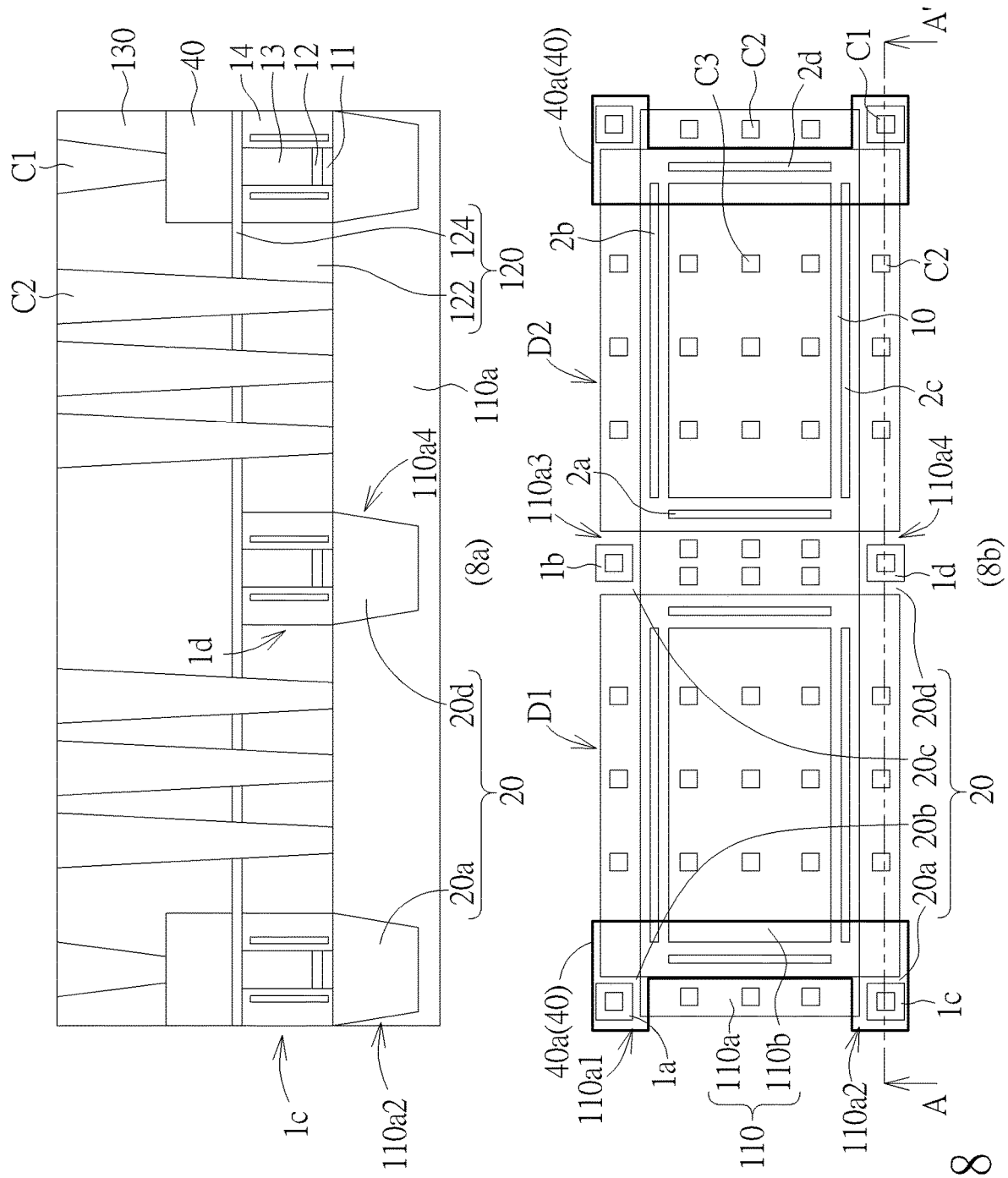
FIG. 8 schematically depicts a top view and a cross-sectional view of a semiconductor process according to an embodiment of the present invention.

FIGS. 4-8 schematically depict a top view and cross-sectional views of a semiconductor process according to an embodiment of the present invention. For clarifying the present invention, FIGS. 4-8 only depict two diodes D1/D2 in a diode area as shown in FIG. 8(*b*). The carried out structure of FIG. 8 is similar to the structure of FIG. 3. A resistive layer 40 having U-shapes 40*a* at a top view is disposed. However, only one of the U-shapes 40*a* is in one corresponding diode D1/D2 in this embodiment. FIG. 8(*a*) is a cross-sectional view along line AA' of FIG. 8(*b*), and FIGS. 4-7,8(*b*) are cross-sectional views of a semiconductor process of forming this structure along line AA' of FIG. 8(*b*). Processes of forming the structure of FIG. 8 are similar to processes of forming the structures of FIGS. 1-3, and thus only the processes of forming the structure of FIG. 8 are described as follows.

Figure 4:
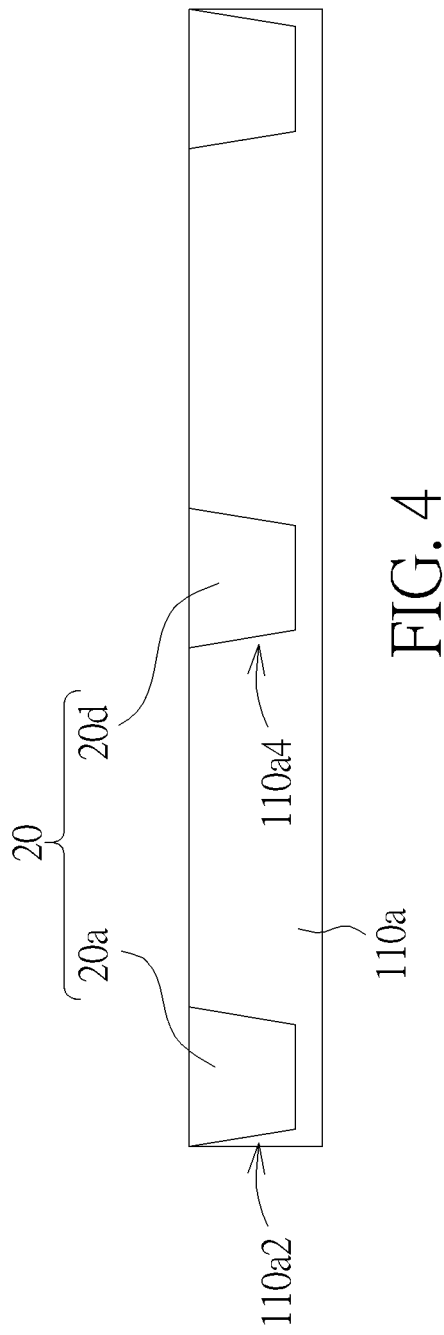
FIG. 4 schematically depicts a cross-sectional view of a semiconductor process according to an embodiment of the present invention.

Please refer to FIG. 4 and FIG. 8(*b*) firstly, the substrate 110 is provided. The first isolation structure 10 and the second isolation structure 20 are formed in the substrate 110. The substrate 110 is thus divided into the first parts 110*a* and the second parts 110*b* by the first isolation structure 10, and the first parts 110*a* surrounds the second parts 110*b* at a top view. Then, the first parts 110*a* and the second parts 110*b* are doped with different conductive type after the first isolation structure and the second isolation structure are formed, for forming diodes. The second isolation structure 20 including isolation parts 20*a*/20*b*/20*c*/20*d* is disposed in the corners 110*a*1/110*a*2/110*a*3/110*a*4 of the first parts 110*a*. In the present invention, the second isolation structure 20 is disposed at at least one corner 110*a*1/110*a*2/110*a*3/110*a*4 of the first parts 110*a*, depending upon practical requirements.

Figure 5:
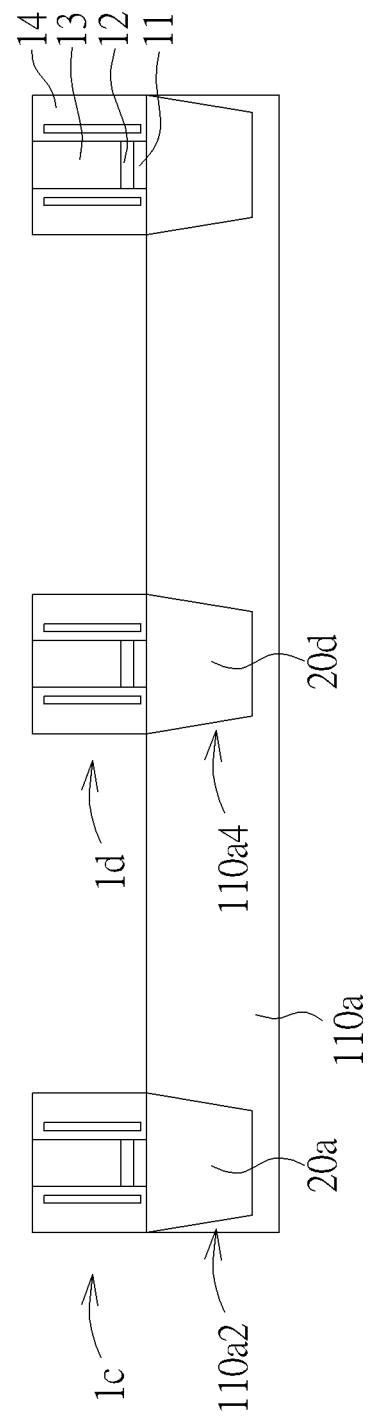
FIG. 5 schematically depicts a cross-sectional view of a semiconductor process according to an embodiment of the present invention.

Please refer to FIG. 5 and FIG. 8(*b*), the dummy pattern 1 including the dummy parts 1*a*/1*b*/1*c*/1*d* are directly disposed on the isolation parts 20*a*/20*b*/20*c*/20*d*. In a preferred embodiment, the dummy parts 1*a*/1*b*/1*c*/1*d* are dummy polysilicon gates, which are formed while polysilicon gates in other areas are formed. This polysilicon gates may be replaced with metal gates by a metal gate replacement (RMG) process, but it is not restricted thereto. Thus, each of the dummy parts 1*a*/1*b*/1*c*/1*d* may include a buffer layer 11, a gate dielectric layer 12 and a polysilicon electrode 13 stacked from bottom to top, and a dual spacer 14 beside the buffer layer 11, the gate dielectric layer 12 and the polysilicon electrode 13, but it is not limited thereto.

In a still preferred embodiment, the line dummy bars 2*a*/2*b*/2*c*/2*d* are also formed on the first isolation structure 10 while the dummy pattern 1 is formed. In the embodiment of FIG. 2, the line dummy frame 2' is formed on the first isolation structure 10 instead of the line dummy bars 2*a*/2*b*/2*c*/2*d* while the dummy pattern 1 is formed.

Please refer to FIG. 6 and FIG. 8(*b*), a first dielectric layer 122 covers the substrate 110 by methods such as depositing and planarizing, and the dummy parts 1*a*/1*b*/1*c*/1*d* are exposed. Due to the dummy parts 1*a*/1*b*/1*c*/1*d* being disposed to increase the pattern density, divots of the first dielectric layer 122 can be avoided. Thus, the first dielectric layer 122 has a flat top surface T. Hence, cracking of above structures and metal residue in the divots of the first dielectric layer 122 can be avoided. The first dielectric layer 122 may be an oxide layer, but it is not limited thereto.

Please refer to FIG. 7 and FIG. 8 (b), a cap layer 124 is deposited on the first dielectric layer 122 and the dummy parts 1a/1b/1c/1d. The cap layer 124 may be a nitride layer, but it is not limited thereto. In this embodiment, the first dielectric layer 122 and the cap layer 124 are sequentially formed to constitute a first dielectric layer 120 covering the substrate 110 and the dummy parts 1a/1b/1c/1d. In another embodiment, the first dielectric layer 120 may be one single layer blanketly covers the substrate 110 and the dummy parts 1a/1b/1c/1d.

Then, the resistive layer 40 is formed on the cap layer 124 right above the dummy parts 1a/1b/1c/1d. The resistive layer 40 may be a single layer or a multilayer. In this embodiment, the resistive layer 40 is a titanium nitride layer, but it is not limited thereto. The resistive layer 40 may be formed by forming blanketly and then patterning. The resistive layer 40 disposed right above the dummy parts 1a/1b/1c/1d can not only save space but also have flexible lengths of the resistive layer 40.

Please refer to FIG. 8(a) and FIG. 8(b), a second dielectric layer 130 covers the cap layer 124 and the resistive layer 40 blanketly. Contact plugs C1/C2/C3 are disposed in the second dielectric layer 130 and the first dielectric layer 120 to contact the resistive layer 40, the first parts 110a and the second parts 110b. More precisely, the second dielectric layer 130 may be patterned to form contact holes (not shown) in the second dielectric layer 130 and the first dielectric layer 120, and then metals such as tungsten or copper etc fills into the contact holes to form the contact plugs C1/C2/C3. The contact plugs C1 directly contact the resistive layer 40, the contact plugs C2 directly contact the first parts 110a, and the contact plugs C3 directly contact the second parts 110b. Therefore, diodes of the present invention including dummy patterns disposed at at least one corner can be fabricated.

Figure 10:
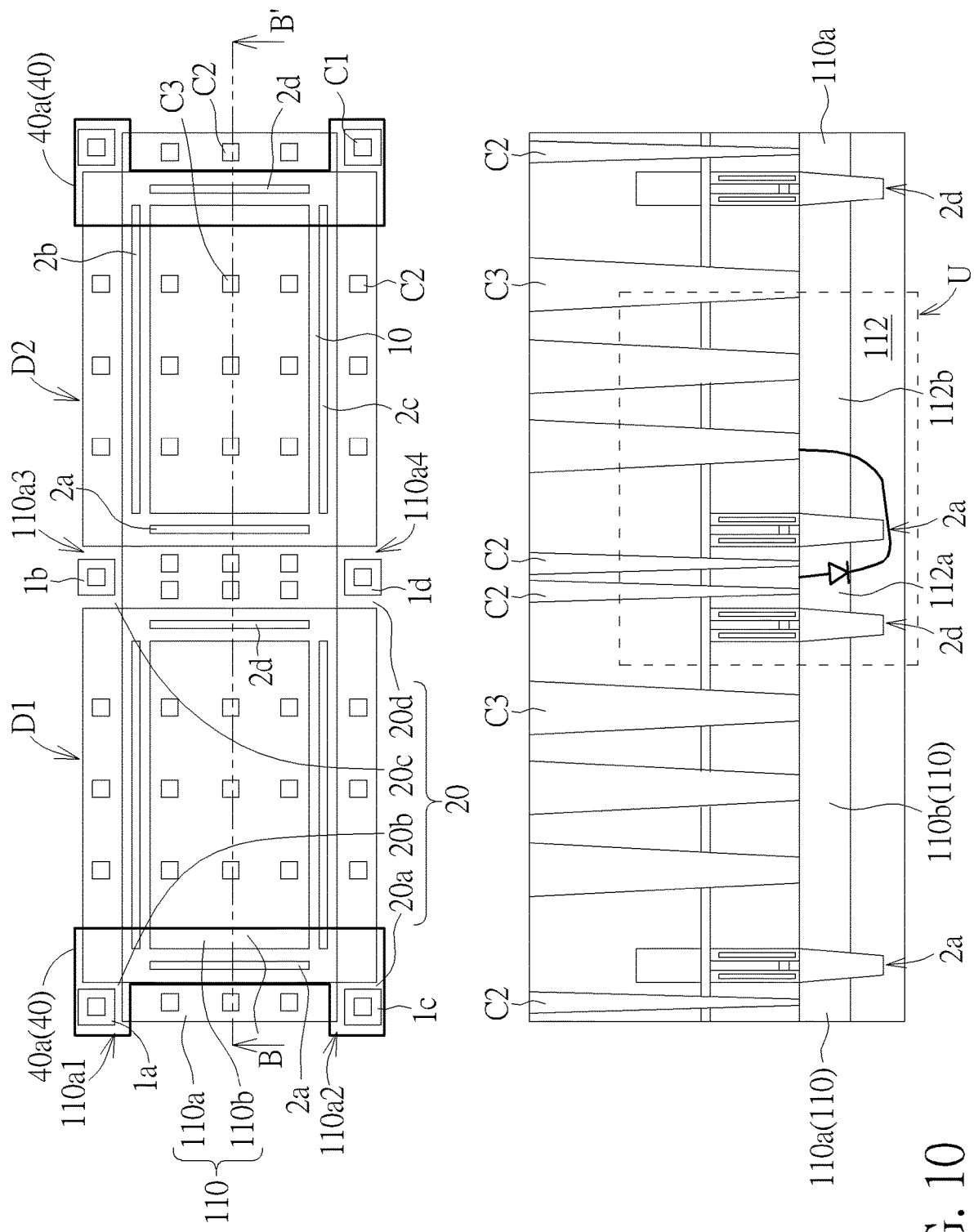
FIG. 10 schematically depicts a top view and a cross-sectional view of a semiconductor structure according to an embodiment of the present invention.

Furthermore, FIG. 10 depicts FIG. 8(b) and a cross-sectional view along line BB' of FIG. 8(b). As shown in FIG. 10, one of the line dummy bar 2a and the corresponding line dummy bar 2d are disposed in two opposite sides of each of the second parts 110b. The structures of the line dummy bars 2a/2b/2c/2d are similar to the structures of the dummy parts 1a/1b/1c/1d, and the line dummy bars 2a/2b/2c/2d and the dummy parts 1a/1b/1c/1d can be formed at a same time, and thus are not described again. The contact plugs C2 directly contact the first parts 110a and the contact plugs C3 directly contact the second parts 110b. The first parts 110a and the second parts 110b may be doped with n-type or p-type dopants, depending upon practical requirements. In one case, the substrate 110 may be a p-type substrate, an N well 112 is formed in the substrate 110 of the first parts 110a and the second parts 110b, and then n+ diffusion regions 112b are formed in the second parts 110b and p+ diffusion regions 112a are formed in the first parts 110a, thereby constituting diode units U. That is, PN junctions between the p+ diffusion regions 112a and the N well 112 have depletion regions. While a positive voltage is applied, current passes through the p+ diffusion regions 112a, the N well 112, and the n+ diffusion regions 112b. While a negative voltage is applied, the diode units U turn off.

To summarize, the present invention provides a semiconductor device and forming method thereof, which forms a first isolation structure and a second isolation structure in a substrate, wherein the substrate is divided into a first part and a second part by the first isolation structure, the first part surrounds the second part at a top view, and the second isolation structure is at at least one corner of the first part; and forms a dummy pattern directly on the second isolation structure. Therefore, the pattern density of a diode area can be increased to prevent divots of dielectric layers, structural cracking above the dielectric layers, and metal residues after planarizing from occurring, and the structural uniformity of this area can be improved as well.

Preferably, the first part has a rectangular frame shape at the top view, and thus the first part has four corners. The second isolation structure includes four isolation parts then disposed at the four corners of the first part respectively. The dummy pattern preferably includes four dummy parts, and the four dummy parts are disposed on the four isolation parts respectively to increase the pattern density. Each of the dummy parts is enclosed by the corresponding isolation part at the top view, to isolate the dummy parts from the first parts. Still preferably, line dummy bars or line dummy frames are disposed on the first isolation structure for further increasing the pattern density.

Moreover, a resistive layer is preferably disposed right above the dummy pattern (and line dummy bars or line dummy frames) for saving space, and having stable structures and flexible lengths of the resistive layer. For instance, the resistive layer may have U-shapes at the top view.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    forming a first isolation structure and a second isolation structure in a substrate, wherein the substrate is divided into a first part and a second part by the first isolation structure, the first part surrounds the second part at a top view, and the second isolation structure is at at least one corner of the first part; and
    forming a dummy pattern directly on the second isolation structure.

2. The method of forming a semiconductor device according to claim 1, further comprising:
    doping the first part and the second part with different conductive type after the first isolation structure and the second isolation structure are formed.

3. The method of forming a semiconductor device according to claim 1, wherein the first part has a rectangular frame shape at the top view, and thus the first part has four corners.

4. The method of forming a semiconductor device according to claim 3, wherein the second isolation structure comprises four isolation parts disposed at the four corners of the first part respectively.

5. The method of forming a semiconductor device according to claim 4, wherein the dummy pattern comprises four dummy parts, and the four dummy parts are disposed on the isolation parts respectively, wherein each of the dummy parts is enclosed by the corresponding isolation part at the top view.

6. The method of forming a semiconductor device according to claim 1, further comprising:
    forming line dummy bars on the first isolation structure while the dummy pattern is formed.

7. The method of forming a semiconductor device according to claim 6, further comprising:
- forming a first dielectric layer covering the substrate and the dummy pattern;
- forming a resistive layer on the first dielectric layer right above the dummy pattern;
- forming a second dielectric layer covering the first dielectric layer and the resistive layer; and
- forming contact plugs in the second dielectric layer and the first dielectric layer to contact the resistive layer, the first part and the second part.

* * * * *